(12) United States Patent
Ali et al.

(10) Patent No.: US 7,554,133 B1
(45) Date of Patent: Jun. 30, 2009

(54) PAD CURRENT SPLITTING

(75) Inventors: Anwar Ali, San Jose, CA (US); Nenad Miladinovic, Campbell, CA (US); Kalyan Doddapaneni, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/119,575

(22) Filed: May 13, 2008

(51) Int. Cl.
*H01L 27/10* (2006.01)
*H01L 29/73* (2006.01)
*H01L 23/52* (2006.01)

(52) U.S. Cl. .................. 257/203; 257/207; 257/208; 257/691; 257/E23.01; 257/E23.015; 257/E23.153

(58) Field of Classification Search ............. 257/203, 257/207–208, 691, E23.01, E23.015, E23.153
See application file for complete search history.

(56) References Cited

U.S. PATENT DOCUMENTS

| 5,401,989 | A | * | 3/1995 | Kikuchi ................. 257/211 |
| 6,222,213 | B1 | * | 4/2001 | Fujiwara ................ 257/210 |
| 6,339,234 | B1 | * | 1/2002 | Takizawa ................ 257/203 |
| 6,744,081 | B2 | * | 6/2004 | Ratchkov et al. ........... 257/207 |
| 6,833,620 | B1 | * | 12/2004 | Rosefield et al. ........... 257/737 |
| 7,361,980 | B2 | * | 4/2008 | Hosoyamada et al. ....... 257/678 |
| 7,368,767 | B2 | * | 5/2008 | Kinoshita et al. .......... 257/202 |
| 7,429,703 | B2 | * | 9/2008 | Davison et al. ............ 174/520 |
| 7,462,887 | B2 | * | 12/2008 | Koike et al. ............. 257/177 |
| 7,491,986 | B2 | * | 2/2009 | Kumagae et al. ........... 257/203 |
| 2002/0157082 | A1 | * | 10/2002 | Shau ..................... 716/19 |
| 2007/0090401 | A1 | * | 4/2007 | Baumann et al. ........... 257/203 |
| 2008/0258177 | A1 | * | 10/2008 | Ikeda et al. .............. 257/207 |

* cited by examiner

*Primary Examiner*—Ida M Soward
(74) *Attorney, Agent, or Firm*—Luedeka, Neely & Graham, P.C.

(57) ABSTRACT

An integrated circuit with a monolithic semiconducting substrate formed in a chip, where the chip has a peripheral edge, a backside, and an opposing top on which circuitry is formed. A first ring of bonding pads is formed along at least a portion of the peripheral edge. At least one of the bonding pads is configured as a power pad, and at least one of the bonding pads is configured as a ground pad. An intermediate power bus is disposed interior to the first ring of bonding pads on the chip, and forms no direct electrical connections to any core devices. An intermediate ground bus is also disposed interior to the first ring of bonding pads on the chip, and forms no direct electrical connections to any core devices. A power pad wire forms an exclusive electrical connection between the power pad and the intermediate power bus. A ground pad wire forms an exclusive electrical connection between the ground pad and the intermediate ground bus. A power strap forms an electrical connection between the intermediate power bus and a power mesh. A ground strap forms an electrical connection between the intermediate ground bus and a ground mesh.

15 Claims, 2 Drawing Sheets

PAD CURRENT SPLITTING

FIELD

This invention relates to the field of integrated circuit design. More particularly, this invention relates to improving power and ground service delivery within integrated circuits.

BACKGROUND

Integrated circuits typically use bonding pads to provide the electrical connections between the integrated circuits and the package substrate, or whatever other element the integrated circuit is interfaced with, such as a circuit board. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

On one side of the logical electrical circuit, the bonding pads form electrical connections to "the outside world." On the other side of the logical electrical circuit, the bonding pads form electrical connections to the other elements of the integrated circuit. Thus, power, ground, and signal connections are all typically formed through the bonding pads.

In wire bonded integrated circuit designs, the bonding pads are typically placed in one or more concentric rings or rows that are disposed around the edges of the chip. Bonding pads for the power and ground services are typically placed on the outermost ring of bonding pads, which are disposed closest to the peripheral edges of the chip. Thus, there are typically one or more concentric rings of bonding pads disposed between the power and ground bonding pads and the active circuitry that requires the power and ground services.

The power and ground services are routed from the bonding pads on electrical leads called pad wires. Pad wires are typically formed in the same metallization process as the bonding pads themselves. The bonding pads in the different concentric rings are typically staggered from row to row, and the pad wires from the power and ground bonding pads in the outer-most row of bonding pads are routed between the bonding pads of the inner rings of the bonding pads. The pad wires are then respectively electrically connected to the power and ground meshes that are typically disposed interior to the innermost ring of bonding pads.

These separate power and ground meshes deliver power and ground services to all of the circuitry in the integrated circuit. The meshes typically reside on a lower layer of the integrated circuit, below the layer in which the bonding pads and pad wires are formed, and also below the dielectric layer that directly underlies the bonding pads and pad wires. Electrically conductive vias through the dielectric layer are used to make the electrical connections between the pad wires and the meshes.

What is needed, therefore, are systems for distributing power and ground services within integrated circuits, which systems fill various needs of the integrated circuit.

SUMMARY

The above and other needs are met by an integrated circuit with a monolithic semiconducting substrate formed in a chip, where the chip has a peripheral edge, a backside, and an opposing top on which circuitry is formed. A first ring of bonding pads is formed along at least a portion of the peripheral edge. At least one of the bonding pads is configured as a power pad, and at least one of the bonding pads is configured as a ground pad. An intermediate power bus is disposed interior to the first ring of bonding pads on the chip, and forms no direct electrical connections to any core devices. An intermediate ground bus is also disposed interior to the first ring of bonding pads on the chip, and forms no direct electrical connections to any core device. A power pad wire forms an exclusive electrical connection between the power pad and the intermediate power bus. A ground pad wire forms an exclusive electrical connection between the ground pad and the intermediate ground bus. A power strap forms an electrical connection between the intermediate power bus and a power mesh. A ground strap forms an electrical connection between the intermediate ground bus and a ground mesh.

In this manner, the connections to and from the intermediate busses provide uniform power from the bonding pads to the meshes. The wires can be formed as wide as needed, or as many as needed can be formed, to deliver the services from the power and ground pads. One of the straps can be placed between any interior rows of bonding pads to deliver the services to the meshes in an efficient manner.

In various embodiments, the first ring of bonding pads is formed in a contiguous pattern completely around the peripheral edge. In some embodiments the power pad is a plurality of power pads, and the ground pad is a plurality of ground pads. In some embodiments a second ring of bonding pads is formed interior to the first ring of bonding pads, and the intermediate power bus and the intermediate ground bus are disposed exterior to the second ring of bonding pads. In some embodiments a plurality of power straps form electrical connections between the intermediate power bus and the power mesh. In some embodiments a plurality of ground straps form electrical connections between the intermediate ground bus and the ground mesh. In some embodiments exactly one of a power strap and a ground strap is disposed between each of the bonding pads of the second ring of bonding pads. In some embodiments a plurality of power pad wires form electrical connections between the power pads and the intermediate power bus, and in some embodiments a plurality of ground pad wires form electrical connections between the ground pads and the intermediate ground bus. In some embodiments neither the intermediate power bus nor the intermediate ground bus form any direct electrical connections to any IO devices.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
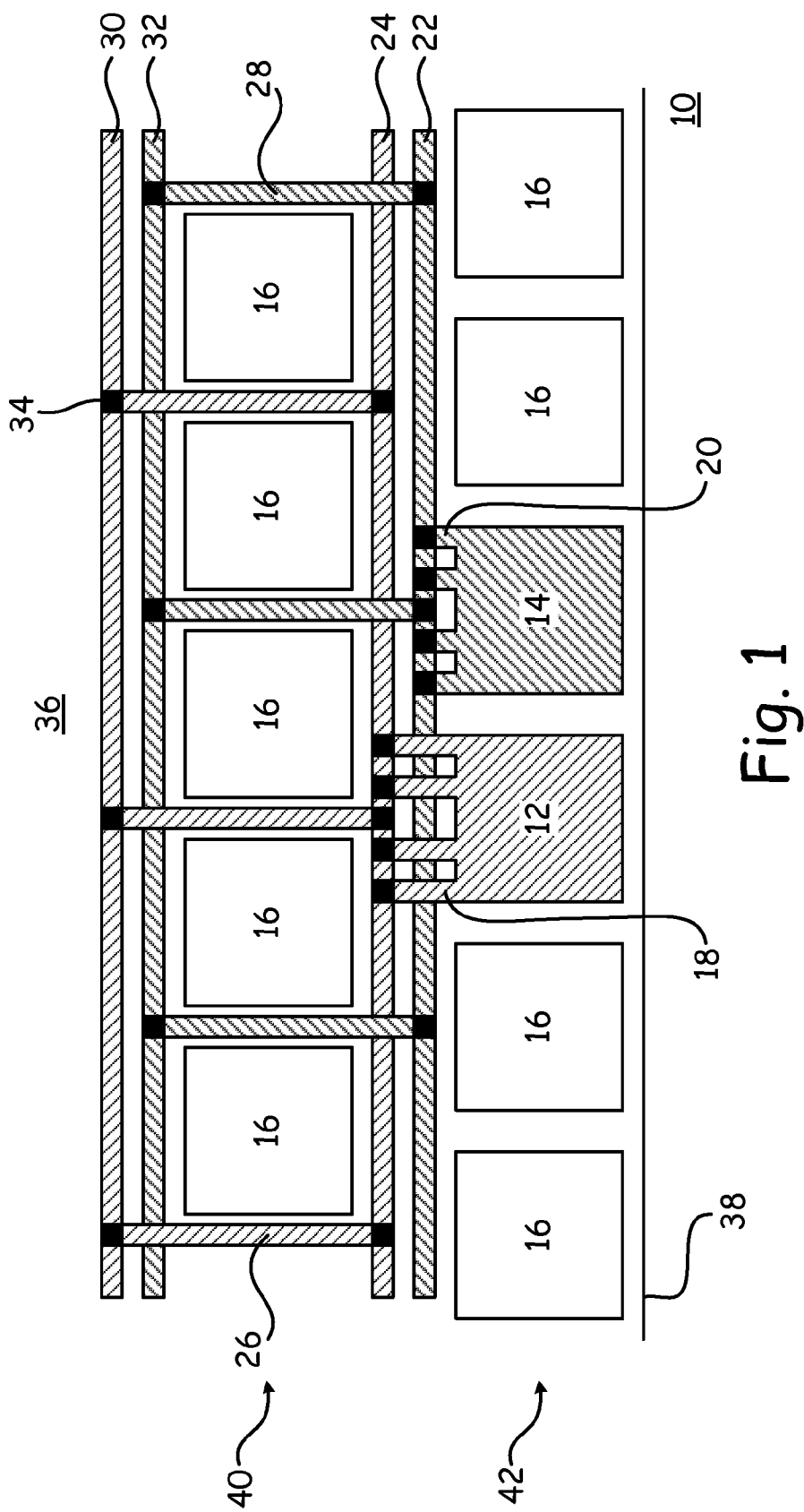
FIG. 1 is a top plan view of a power and ground routing system according to a first embodiment of the present invention.

With reference now to FIG. 1, there is depicted a top plan view of a power and ground routing system for an integrated circuit 10 according to a first embodiment of the present invention. The edge of the integrated circuit 10 is given at 38, and the interior of the integrated circuit 10 is given as 36. Depicted in this embodiment are portions of two rows or rings 40 and 42 of bonding pads 12, 14, and 16, where row 42 is the outermost ring of bonding pads, and row 40 is the next adjacent ring of bonding pads. In the embodiment as depicted in FIG. 1, row 40 is also the innermost ring of bonding pads. However, it is appreciated that in other embodiments, there may be more than two rows or rings of bonding pads.

Bonding pad 12 is a power supply bonding pad, and bonding pad 14 is a ground supply bonding pad. Bonding pads 16 are either signal bonding pads, or unspecified power or ground bonding pads. Power and ground bonding pads 12 and 14 may be placed on any row of bonding pads, and are not limited to just the outer most row of pads 42. Also depicted in FIG. 1 are the power pad wires 18 for the power bonding pad 12, and the ground pad wires 20 for the ground bonding pad 14. As depicted in this embodiment, the pad wires 18 and 20 are formed in the same metallization layer as the bonding pads 12, 14, and 16. However, in other embodiments the wires 18 and 20, and even all of the bonding pads 12, 14, and 16, could have been formed in separate metallization processes and of different metals.

In a prior art power and ground supply system, the pad wires 18 and 20 would run directly from the bonding pads 12 and 14, respectively, to one of the associated power mesh 30 and ground mesh 32, which meshes for the core devices are typically disposed interior to the innermost ring 40 of bonding pads. However, according to this embodiment of the present invention, the pad wires 18 and 20 do not make physical contact with the power mesh system 30 and the ground mesh system 32. Instead, the power pad wires 18 make physical and electrical contact with an intermediate power bus 24, which is disposed between the outermost ring 42 of bonding pads and the next adjacent ring 40 of bonding pads. Similarly, the ground pad wires 20 make physical and electrical contact with an intermediate ground bus 22, which is also disposed between the outermost ring 42 of bonding pads and the next adjacent ring 40 of bonding pads.

In some embodiments, both the intermediate busses 22 and 24 and the meshes 30 and 32 are formed on electrically conductive layers that are disposed beneath the electrically conductive layer on which the bonding pads 12, 14, and 16 are formed. Between these electrically conductive layers are disposed electrically insulating dielectric layers. Electrical connections are formed between the layers using electrically conductive vias 34 that go through the one or more intervening dielectric layers. In some embodiments, the intermediate busses 22 and 24 are formed at the same times as, on the same levels as, and of the same materials as the power and ground meshes 30 and 32. For example, the intermediate power bus 24 and the power mesh 30 could be formed on one layer at one time, and the intermediate ground bus 22 and the ground mesh 32 could be formed on another layer at another time.

The intermediate busses 22 and 24 run in an unbroken loop around the entire periphery of the integrated circuit 10 in some embodiments. In other embodiments, the intermediate busses 22 and 24 are broken into discrete portions that are disposed at needed portions of the periphery of the integrated circuit 10. As depicted in FIG. 1, there is only one intermediate power bus 24 and only one intermediate ground buss 22. However, in other embodiments there may be more than one of each. Further, there may be additional intermediate busses that provide power at several different power levels, such as plus five volts, plus three volts, plus 1.5 volts, negative three volts, and so forth. The ground is at zero volts in some embodiments.

Although only one power bonding pad 12 and only ground bonding pad 14 are depicted in FIG. 1, it is understood that in most embodiments there would be many such power and ground bonding pads 12 and 14, which would be distributed around the periphery of the integrated circuit 10 as needed to provide power and ground in appropriate supply for the needs of the integrated circuit 10. In some embodiments, these additional power bonding pads 12 would all be attached by power pad wires 18 to the same intermediate power bus 24 that completely encircles the entire integrated circuit 10, and the additional ground bonding pads 14 would similarly all be attached by ground pad wires 20 to the same intermediate ground bus 22 that also completely encircles the entire integrated circuit 10.

As depicted in the embodiment of FIG. 1, there are several power pad wires 18 provided for the electrical connection between the power bonding pad 12 and the intermediate power bus 24. In other embodiments there could be just one power pad wire 18, but it could be very wide. In another embodiment, the entire width of the power bonding pad 12 is brought to the intermediate power bus 24, and multiple vias, or one large via, are used to make the electrical connections between the power bonding pad 12 and the intermediate power bus 24.

The widths of the intermediate busses 22 and 24 can be increased by increasing the vertical pitch between the rows 40 and 42 of bonding pads. Increasing the vertical spacing between these pad rows 40 and 42 has relatively little affect on the size of the integrated circuit 10, and can therefore be done with virtually no additional impact to the cost of the integrated circuit 10. Increasing the size or the number of the intermediate busses 22 and 24 can help deliver the power and ground services with less voltage drop through the intermediate busses 22 and 24, due to the reduced resistance that multiple busses or wider busses would provide.

Power straps 26 are created between the intermediate power bus 24 and the power mesh 30, with vias 34 making the physical and electrical connections through the one or more intervening dielectric layers. Similarly, ground straps 28 are created between the intermediate ground bus 22 and the ground mesh 32, again with vias 34 making the physical and electrical connections through the one or more intervening dielectric layers.

In some embodiments the straps 26 and 28 are formed in the same metallization process and on the same level as the bonding pads 12, 14, and 16 and the pad wires 18 and 20. In other embodiments, all of these elements are formed at different times and on different levels.

In some embodiments, one of either the power straps 26 or the ground straps 28 is disposed between every two adjacent bonding pads 16 that are disposed in the next adjacent ring 40 of bonding pads. If additional interior rings of bonding pads are provided, then in some embodiments, one of either the power straps 26 or the ground straps 28 is disposed between every two adjacent bonding pads 16 in those rings as well, until the respective power mesh 30 or ground mesh 32 is attained by the straps 26 and 28.

By providing many straps 26 and 28 on which to carry the power and ground services between the intermediate busses 22 and 24 and the meshes 30 and 32, electrical bottlenecks can be removed in the distribution system. For example, if too much power is required to be conducted on a single power strap 26, because not a great enough number of power straps 26 are provided, then there would tend to be an unacceptable voltage drop along the strap. Similarly, problems with electromigration of the metal of the power strap 26 could also arise. However, by providing a sufficient number of straps 26 and 28, such problems are avoided. In addition, providing multiple straps 26 and 28 provides for a very uniform distribution of power and ground services. This could result in a general reduction in the number of power and ground bonding pads 12 and 14 that are required by the integrated circuit 10. A reduction in the number of pads required tends to reduce the die area and the die cost.

Figure 2:
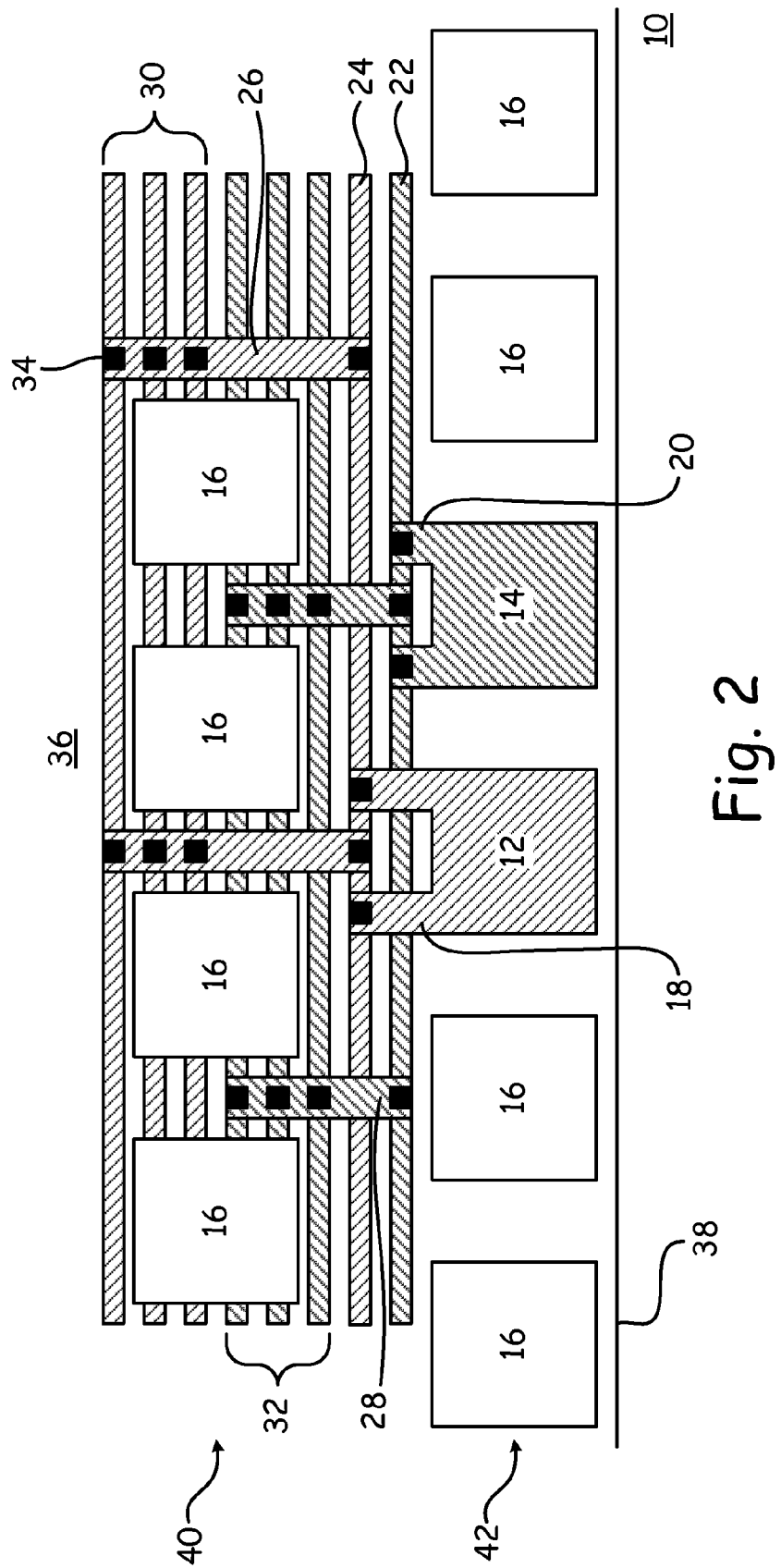
FIG. 2 is a top plan view of a power and ground routing system according to a second embodiment of the present invention.

With reference now to FIG. 2, there is depicted an embodiment where the power pad wires 18, ground pad wires 20, power straps 26, and ground straps 28 are wider. In addition, the power and ground straps 26 and 28 form electrical connections from the intermediate power bus 24 and the intermediate ground bus 22, respectively, to multiple power meshes 30 and multiple ground meshes 32, respectively. For example, in some embodiments the power straps 30 make electrical connections to both the IO power mesh and the core power mesh, represented generally as 30 in the embodiment depicted in FIG. 2. Similarly, in some embodiments the ground straps 32 make electrical connections to both the IO ground mesh and the core ground mesh, represented generally as 32 in the embodiment depicted in FIG. 2.

The intermediate busses 22 and 24 in some embodiments are positioned more or less directly above portions of the IO meshes, such that vias 34 directly connect the busses 22 and 24 to the IO meshes without the need for any straps 26 and 28. This further improves current distribution. The intermediate busses can also be directly connected through vias 34 to the core power and ground meshes, if these meshes overlap beneath the intermediate busses 22 and 24.

Because multiple straps 26 and 28 are used to carry current from the intermediate busses 22 and 24 to the meshes 30 and 32, the width of each strap 26 and 28 becomes less important. This allows the spacing between adjacent bonding pads to be generally reduced without any penalty in terms of electrical properties, again thereby reducing the die size and the die cost.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An integrated circuit, comprising:
    a monolithic semiconducting substrate formed in a chip, the chip having a peripheral edge, a backside, and an opposing top on which circuitry is formed,
    a first ring of bonding pads formed along at least a portion of the peripheral edge, at least one of the bonding pads configured as a power pad and at least one of the bonding pads configured as a ground pad,
    an intermediate power bus disposed interior to the first ring of bonding pads on the chip, the intermediate power bus forming no direct electrical connections to any core devices,
    an intermediate ground bus disposed interior to the first ring of bonding pads on the chip, the intermediate ground bus forming no direct electrical connections to any core devices,
    a power pad wire forming an exclusive electrical connection to the power pad at a first end of the power pad wire, and forming an electrical connection to the intermediate power bus at a second end of the power pad wire,
    a ground pad wire forming an exclusive electrical connection to the ground pad at a first end of the ground pad wire, and forming an electrical connection to the intermediate ground bus at a second end of the ground pad wire,
    a power strap forming an electrical connection to the intermediate power bus at a first end of the power strap, and forming an electrical connection to a power mesh at a second end of the power strap, and
    a ground strap forming an electrical connection to the intermediate ground bus at a first end of the ground strap, and forming an electrical connection to a ground mesh at a second end of the ground strap.

2. The integrated circuit of claim 1, wherein the first ring of bonding pads is formed in a contiguous pattern completely around the peripheral edge.

3. The integrated circuit of claim 1, wherein the power pad comprises a plurality of power pads.

4. The integrated circuit of claim 1, wherein the ground pad comprises a plurality of ground pads.

5. The integrated circuit of claim 1, wherein a second ring of bonding pads is formed interior to the first ring of bonding pads, and the intermediate power bus and the intermediate ground bus are disposed exterior to the second ring of bonding pads.

6. The integrated circuit of claim 1, wherein:
    a second ring of bonding pads is formed interior to the first ring of bonding pads,
    the intermediate power bus and the intermediate ground bus are disposed exterior to the second ring of bonding pads,
    a plurality of power straps form electrical connections between the intermediate power bus and the power mesh,
    a plurality of ground straps form electrical connections between the intermediate ground bus and the ground mesh,
    exactly one of a power strap and a ground strap is disposed between each of the bonding pads of the second ring of bonding pads.

7. The integrated circuit of claim 1, wherein a plurality of power pad wires form electrical connections between the power pads and the intermediate power bus.

8. The integrated circuit of claim 1, wherein a plurality of ground pad wires form electrical connections between the ground pads and the intermediate ground bus.

9. The integrated circuit of claim 1, wherein a plurality of power straps form electrical connections between the intermediate power bus and the power mesh.

10. The integrated circuit of claim 1, wherein a plurality of ground straps form electrical connections between the intermediate ground bus and the ground mesh.

11. The integrated circuit of claim 1, wherein neither the intermediate power bus nor the intermediate ground bus form any direct electrical connections to any IO devices.

12. An integrated circuit, comprising:
    a monolithic semiconducting substrate formed in a chip, the chip having a peripheral edge, a backside, and an opposing top on which circuitry is formed, a first ring of bonding pads formed in a contiguous pattern completely around the peripheral edge, a plurality of the bonding pads configured as power pads and a plurality of the bonding pads configured as ground pads, an intermediate power bus disposed interior to the first ring of bonding pads on the chip, the intermediate power bus forming no direct electrical connections to any core devices, an intermediate ground bus disposed interior to the first ring of bonding pads on the chip, the intermediate ground bus forming no direct electrical connections to any core devices, power pad wires forming exclusive electrical connections to the power pads at first ends of the power pad wires, and forming electrical connections to the intermediate power bus at second ends of the power pad wires, ground pad wires forming exclusive electrical connection to the ground pads at first ends of the ground pad wires, and forming electrical connections to the intermediate ground bus at second ends of the ground pad wires, power straps forming electrical connections to the intermediate power bus at first ends of the power straps, and forming electrical connections to a power mesh at second ends of the power straps, and ground straps forming electrical connections to the intermediate ground bus at first ends of the ground straps, and forming electrical connections to a ground mesh at second ends of the ground straps.

13. The integrated circuit of claim 12, wherein a second ring of bonding pads is formed interior to the first ring of bonding pads, and the intermediate power bus and the intermediate ground bus are disposed exterior to the second ring of bonding pads.

14. The integrated circuit of claim 12, wherein:

a second ring of bonding pads is formed interior to the first ring of bonding pads, the intermediate power bus and the intermediate ground bus are disposed exterior to the second ring of bonding pads, and exactly one of one of the power straps and one of the ground straps is disposed between each of the bonding pads of the second ring of bonding pads.

15. An integrated circuit, comprising:

a monolithic semiconducting substrate formed in a chip, the chip having a peripheral edge, a backside, and an opposing top on which circuitry is formed, a first ring of bonding pads formed in a contiguous pattern completely around the peripheral edge, a plurality of the bonding pads configured as power pads and a plurality of the bonding pads configured as ground pads, a second ring of bonding pads formed interior to the first ring of bonding pads, an intermediate power bus disposed interior to the first ring of bonding pads and exterior to the second ring of bonding pads on the chip, the intermediate power bus forming no direct electrical connections to any core devices, an intermediate ground bus disposed interior to the first ring of bonding pads and exterior to the second ring of bonding pads on the chip, the intermediate ground bus forming no direct electrical connections to any core devices, power pad wires forming exclusive electrical connections to the power pads at first ends of the power pad wires, and forming electrical connections to the intermediate power bus at second ends of the power pad wires, ground pad wires forming exclusive electrical connection to the ground pads at first ends of the ground pad wires, and forming electrical connections to the intermediate ground bus at second ends of the ground pad wires, power straps forming electrical connections to the intermediate power bus at first ends of the power straps, and forming electrical connections to a power mesh at second ends of the power straps, ground straps forming electrical connections to the intermediate ground bus at first ends of the ground straps, and forming electrical connections to a ground mesh at second ends of the ground straps, and exactly one of one of the power straps and one of the ground straps is disposed between each of the bonding pads of the second ring of bonding pads.

\* \* \* \* \*